US009053937B2

(12) United States Patent
Park et al.

(10) Patent No.: US 9,053,937 B2
(45) Date of Patent: Jun. 9, 2015

(54) SEMICONDUCTOR DEVICE AND METHOD OF MANUFACTURING THE SAME

(75) Inventors: Sang Hee Park, Daejeon (KR); Chi Sun Hwang, Daejeon (KR); Chun Won Byun, Daejeon (KR); Elvira M. C. Fortunato, Caparica (PT); Rodrigo F. P. Martins, Caparica (PT); Ana R. X. Barros, Caparica (PT); Nuno F. O. Correia, Caparica (PT); Pedro M. C. Barquinha, Caparica (PT); Vitor M. L. Figueiredo, Caparica (PT)

(73) Assignees: ELECTRONICS AND TELECOMMUNICATIONS RESEARCH INSTITUTE, Daejeon (KR); FACULTY OF SCIENCE AND TECHNOLOGY NEW UNIVERSITY OF LISBON, Caparica (PT)

( * ) Notice: Subject to any disclaimer, the term of this patent is extended or adjusted under 35 U.S.C. 154(b) by 980 days.

(21) Appl. No.: 13/087,363

(22) Filed: Apr. 14, 2011

(65) Prior Publication Data

US 2011/0253997 A1    Oct. 20, 2011

(30) Foreign Application Priority Data

Apr. 15, 2010  (KR) .................. 10-2010-0034881
Oct. 26, 2010  (KR) .................. 10-2010-0104744

(51) Int. Cl.
*H01L 29/22* (2006.01)
*H01L 21/02* (2006.01)
(Continued)

(52) U.S. Cl.
CPC .......... *H01L 21/02565* (2013.01); *C23C 14/08* (2013.01); *C23C 14/086* (2013.01);
(Continued)

(58) Field of Classification Search
CPC ......................................... H01L 29/22
USPC .............. 257/43, E29.094, E21.461; 438/104
See application file for complete search history.

(56) References Cited

U.S. PATENT DOCUMENTS 6,236,061 B1 *  5/2001  Walpita ........................ 257/40
2005/0139825 A1   6/2005  Song et al.
2005/0275340 A1 * 12/2005  Choi et al. ................... 313/503
(Continued)

FOREIGN PATENT DOCUMENTS

KR   10-2008-0064592 A    7/2008
KR   10-2009-0065271 A    6/2009
(Continued)

OTHER PUBLICATIONS

Kosuke Matsuzaki et al., "Epitaxial growth of high mobility Cu$_2$O thin films and application to p-channel thin film transistor", Applied Physics Letters, 93, 202107, Nov. 20, 2008, pp. 202107-1-202107-3.
(Continued)

*Primary Examiner* — Marc Armand
(74) *Attorney, Agent, or Firm* — Rabin & Berdo, P.C.

(57) ABSTRACT

Provided is a semiconductor device using a p-type oxide semiconductor layer and a method of manufacturing the same. The device includes the p-type oxide layer formed of at least one oxide selected from the group consisting of a copper (Cu)-containing copper monoxide, a tin(Sn)-containing tin monoxide, a copper tin oxide containing a Cu—Sn alloy, and a nickel tin oxide containing a Ni—Sn alloy. Thus, transparent or opaque devices are easily developed using the p-type oxide layer. Since an oxide layer that is formed using a low-temperature process is applied to a semiconductor device, the manufacturing process of the semiconductor device is simplified and manufacturing costs may be reduced.

17 Claims, 10 Drawing Sheets

(51) Int. Cl.
*C23C 14/08* (2006.01)
*H01L 27/12* (2006.01)
*H01L 29/49* (2006.01)
*H01L 29/786* (2006.01)
*H01L 29/94* (2006.01)
*H01L 29/66* (2006.01)
*H01L 21/8238* (2006.01)
*H01L 27/092* (2006.01)

(52) U.S. Cl.
CPC ........ *C23C14/087* (2013.01); *H01L 21/02422* (2013.01); *H01L 21/02579* (2013.01); *H01L 21/02617* (2013.01); *H01L 21/02628* (2013.01); *H01L 21/02631* (2013.01); *H01L 21/823857* (2013.01); *H01L 27/092* (2013.01); *H01L 27/1203* (2013.01); *H01L 29/4908* (2013.01); *H01L 29/7869* (2013.01); *H01L 29/94* (2013.01); *H01L 29/66969* (2013.01)

(56) References Cited

U.S. PATENT DOCUMENTS

| 2007/0003877 | A1  | 1/2007  | Punsalan et al. |
| 2009/0117405 | A1* | 5/2009  | Nashiki et al. ................. 428/697 |
| 2010/0090216 | A1  | 4/2010  | Ferrao De Paiva Martins et al. |
| 2010/0252108 | A1* | 10/2010 | Singh et al. .................... 136/261 |
| 2011/0089559 | A1* | 4/2011  | Scheer et al. ................... 257/734 |

FOREIGN PATENT DOCUMENTS

| KR | 10-0939988     | B1 | 2/2010  |
| KR | 10-2010-0045600| A  | 5/2010  |
| WO | WO-2008/097117 | A1 | 8/2008  |
| WO | WO-2009/120024 | A2 | 10/2009 |

OTHER PUBLICATIONS

Elvira Fortunato et al., "Thin-film transistors based on p-type $Cu_2O$ thin films produced at room temperature", Applied Physics Letters 96, 192102, May 10, 2010, pp. 192102-1-192102-3.

* cited by examiner

SEMICONDUCTOR DEVICE AND METHOD OF MANUFACTURING THE SAME

CROSS-REFERENCE TO RELATED APPLICATION

This application claims priority to and the benefit of Korean Patent Application Nos. 10-2010-0034881 filed Apr. 15, 2010, and 10-2010-0104744 filed Oct. 26, 2010, the disclosure of which is incorporated herein by reference in its entirety.

BACKGROUND

1. Field of the Invention

The present invention relates to a semiconductor device and a method of manufacturing the same and, more particularly, to a semiconductor device to which a p-type oxide layer is applied and a method of manufacturing the same.

2. Discussion of Related Art

In recent years, oxides have been applied in various fields. The oxides may be used as transparent conductive oxides (TCOs) in the fields of electrons or photoelectrons or employed as anti-reflective layers (ARLs) of photoelectronic or optical devices. The oxides may undergo processes at room temperature.

Since research on active n-type oxide semiconductor devices using oxide materials was initially proposed by H. Hosono, research has expanded into low-temperature or high-temperature processes, and amorphous active n-type oxide semiconductor devices have been further embodied.

However, conventional techniques are limited to applying oxide semiconductor materials to heterojunction devices, such as light emitting diode (LED) devices or field emission devices (FEDs). Techniques for applying p-type oxide semiconductors to active-matrix driver devices, complementary-metal-oxide-semiconductor (CMOS) devices, or various logic devices driven at high and low voltages are hardly known.

Although p-type oxides using SnO processed at a high temperature are conventionally known, the corresponding p-type oxides do not contain tin (Sn) but are processed at a high temperature of about 575° C. so that the p-type oxides may turn into polycrystalline layer structures during an initial stage of the processing procedure.

In addition, although a method of employing copper monoxide as a channel layer of a p-type thin film transistor (TFT) was proposed, since the corresponding channel layer is processed at a high temperature of at least 600° C., the channel layer always has a polycrystalline structure. Furthermore, it has not been verified whether copper contained in the corresponding channel layer exists.

Moreover, while a method of manufacturing a PN junction device using nickel oxide (NiO) as a p-type material has been proposed, a high-temperature process may be required.

SUMMARY OF THE INVENTION

The present invention is directed to a semiconductor device including a p-type oxide semiconductor layer formed of a metal-containing oxide as a base material.

One aspect of the present invention provides a semiconductor device including a p-type oxide layer formed of at least one oxide selected from the group consisting of a copper(Cu)-containing copper monoxide, a tin(Sn)-containing tin monoxide, a copper tin oxide containing a Cu—Sn alloy, and a nickel tin oxide containing a Ni—Sn alloy.

Another aspect of the present invention provides a method of manufacturing a semiconductor device, which includes forming a p-type oxide layer on a substrate, the p-type oxide layer formed of at least one oxide selected from the group consisting of a Cu-containing copper monoxide, a Sn-containing tin monoxide, a copper tin oxide containing a Cu—Sn alloy, and a nickel tin oxide containing a Ni—Sn alloy.

BRIEF DESCRIPTION OF THE DRAWINGS

The above and other features and advantages of the present invention will become more apparent to those of ordinary skill in the art by describing in detail exemplary embodiments thereof with reference to the attached drawings in which.

DETAILED DESCRIPTION OF EMBODIMENTS

The present invention will now be described more fully hereinafter with reference to the accompanying drawings, in which exemplary embodiments of the invention are shown.

Figure 1:
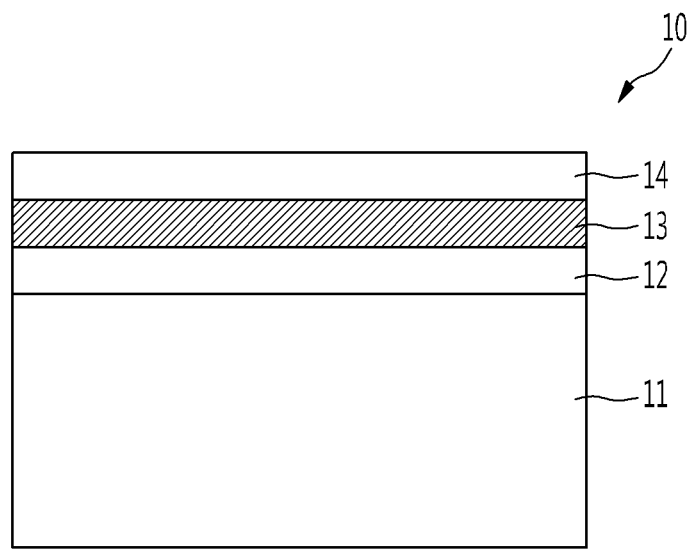
FIG. 1 is a cross-sectional view of a semiconductor device according to an exemplary embodiment of the present invention.

FIG. 1 is a cross-sectional view of a semiconductor device according to an exemplary embodiment of the present invention.

Referring to FIG. 1, a semiconductor device 10 according to an exemplary embodiment of the present invention may include a p-type oxide layer 13 disposed on a substrate 11. Here, the p-type oxide layer 13 refers to a multi-composition metal oxide, such as a binary metal oxide, a ternary metal oxide, or a quaternary metal oxide, which may contain a metal or an alloy to exhibit p-type semiconductor characteristics. In particular, the p-type oxide layer 13 may be formed of a monoxide containing copper (Cu), tin (Sn), nickel (Ni), or an alloy thereof.

The substrate 11 may be an insulating substrate, a conductive substrate, or a semiconductor substrate according to the purpose of the semiconductor device 10. For example, the insulating substrate may be formed of glass, a polymer, cellulose paper, or bio-organic paper. The conductive substrate may be formed of stainless steel or molybdenum, and the semiconductor substrate may be formed of single crystalline/polycrystalline silicon or an oxide. Here, the cellulose paper or bio-organic paper may function as both a substrate and an insulating layer.

In addition, the substrate 11 may be a flexible substrate or a nonflexible substrate according to the purpose of the semiconductor device 10. For example, the flexible substrate may be cellulose paper, and the nonflexible substrate may be formed of glass, silicon, a polymer, a metal, or metal foil. Here, the metal foil may refer to a metal layer having a surface coated with an insulating material.

The p-type oxide layer 13 may be based on at least one oxide selected from the group consisting of a Cu-containing copper monoxide, a Sn-containing tin monoxide, a copper tin oxide containing a Cu—Sn alloy, and a nickel tin oxide containing a Ni—Sn alloy.

Here, the copper monoxide may be expressed by the formula $(OCu_2)_x+(Cu_{1-2})_y$, where x and y may satisfy inequalities $0.05 \leq x < 1$ and $0.01 \leq y \leq 0.9$, respectively. The tin monoxide may be expressed by the formula $(OSn)_z+(Sn_{1-2})_w$ where z and w may satisfy inequalities $0.05 \leq z < 1$ and $0.01 \leq w \leq 0.9$, respectively. The copper tin oxide may be expressed by the formula $(O—Cu—Sn)_a+(Cu_\alpha—Sn_\beta)_b$. Here, $\alpha$ and $\beta$ may satisfy inequalities $0 < \alpha < 2$ and $0 < \beta < 2$, respectively, and a and b may satisfy inequalities $0.05 \leq a < 1$ and $0.01 \leq b \leq 0.9$, respectively. The nickel tin oxide may be expressed by the formula $(O—Ni)_a+(Ni_\alpha—Sn_{62})_b$. Here, $\alpha$ and $\beta$ may satisfy inequalities $0 < \alpha < 2$ and $0 < \beta < 2$, respectively, and a and b may satisfy inequalities $0.05 \leq a < 1$ and $0.01 \leq b \leq 0.9$, respectively.

The p-type oxide layer 13 having the above-described composition may have an amorphous structure, nanocrystalline structure, or polycrystalline structure and a stoichiometrical or non-stoichiometrical composition according to the composition and contained metal of the p-type oxide layer 13. To form the p-type oxide layer 13 having a desired structure, ultraviolet (UV) light or ozone ($O_3$) may be irradiated during a deposition process.

The p-type oxide layer 13 may have nonconductor, conductor, or semiconductor characteristics according to oxygen ($O_2$) content. For example, when the p-type oxide layer 13 is formed using a physical vapor deposition (PVD) process or a chemical vapor deposition (CVD) process, the oxygen partial pressure may be controlled during a deposition process, thereby controlling the electric conductivity of the p-type oxide layer. In addition, the p-type oxide layer 13 may have an electric conductivity between $10^{-14}$ and $10^5$ S/cm. For example, the p-type oxide layer 13 having high conductivity may be applied to a passive device and used for an ohmic contact. In this case, the transparency of the p-type oxide layer 13 may also be varied. Furthermore, the p-type oxide layer 13 having an electric conductivity of about $10^{-6}$ S/cm or lower may be used as an electron or hole blocking layer.

The resistivity of the p-type oxide layer 13 may be controlled according to the oxygen partial pressure during the formation of the p-type oxide layer 13. For example, when the p-type oxide layer 13 is formed as a channel layer of a thin-film transistor (TFT), the p-type oxide layer 13 may have a resistivity between $10^{11}$ and $10^0$ $\Omega$cm. When the p-type oxide layer 13 is formed as a gate electrode and source and drain electrodes of the TFT, the p-type oxide layer 13 may have a resistivity between $10^0$ to $10^{-6}$ $\Omega$cm. Also, the p-type oxide layer 13 having an electric resistance may be used as an insulator.

The thickness of the p-type oxide layer 13 may be controlled according to the purpose of a device to which the p-type oxide layer 13 is applied. For instance, when the p-type oxide layer 13 is used as the channel layer of the TFT, the p-type oxide layer 13 may be formed to a thickness between 0.5 and 100000 nm. When the p-type oxide layer 13 is used as the gate electrode and source and drain electrodes of the TFT, the p-type oxide layer 13 may be formed to a thickness between 2 and 1000000 nm.

During the formation of the p-type oxide layer 13, impurities for controlling hole carriers may be added if required. For example, to finely control the electric conductivity and number of free holes of the p-type oxide layer 13, impurities, such as zirconium (Zr) or nitrogen (N), may be added, and impurities of 0.2% by weight, based on a total weight of the entire composition of the p-type oxide layer 13, may be added. Also, one or two fundamental composition elements of the p-type oxide layer 13 may be replaced by the impurities if required.

The formation of the p-type oxide layer 13 may be performed at room temperature or a temperature of about 200° C. or lower. The formation of each of the p-type oxide layers 13 or the manufacture of a device may be followed by performing an annealing process at a temperature of about 250° C. or lower if required.

Each of the p-type oxide layers 13 may further contain impurities of 1% or less by weight, based on a total weight of the entire composition thereof. Also, a deficiency degree of electrons of the p-type oxide layer 13 may be controlled by adding impurities to the p-type oxide layer 13, thereby controlling the transparency of the p-type oxide layer 13. Accordingly, a transparent, conductive p-type oxide layer 13 may be obtained and used as a transparent p-type electrode.

For example, the p-type oxide layer 13 may be formed in the atmosphere of argon (Ar) gas under a pressure between $10^5$ and $10^{-6}$ Pa. In this case, a partial pressure of Ar gas may range between 10 and $10^{-5}$ Pa. Oxygen (O), nitrogen (N) or fluoride (F) may be added. When F is added, the content of F may be 0.00 to 0.99% by weight of Oxygen. The power of a deposition apparatus, that is, the process energy function, may range between 0.1 and 20 W/cm$^2$, and the distance between a source and the substrate 1 may range between 2 and 50 cm. Furthermore, after forming the p-type oxide layer 13, an annealing process may be performed for about 20 minutes to 6 hours at a temperature between 50 and 250° C.

As described above, the present invention may provide oxide layers having p-type semiconductor characteristics by adding metals or alloys to oxides. The oxide layers having the p-type semiconductor characteristics may be applied to passive devices to form ohmic contacts or applied to active devices, such as TFTs, complementary-metal-oxide-semiconductor (CMOS) devices, PN junction devices, metal-insulator-semiconductor (MIS) junction devices, light emitting diode (LED) devices, and optical sensors, and used as p-type active channel layers, p-type semiconductor layers, gate electrodes, and source and drain electrodes.

Meanwhile, the semiconductor device 10 according to the embodiment of the present invention may further include a matching layer 12 interposed between the substrate 11 and the p-type oxide layer 13. For example, when the p-type oxide layer 13 is used as a channel layer, the matching layer 12 may be interposed between a gate insulating layer (not shown) and the channel layer. Interface characteristics between the gate insulating layer and the channel layer may be improved, thereby enhancing the properties of a p-type transistor. The matching layer 12 may be formed of tantalum(Ta) pentoxide to a thickness between 1 and 1000 nm.

In addition, the semiconductor device 10 according to the embodiment of the present invention may further include a protective layer 14 disposed on the p-type oxide layer 13. The protective layer 14 may function to prevent degradation of the properties of the p-type oxide layer 13 during a subsequent process. The protective layer 14 may be formed using an insulating layer containing SU-8, a polymer, magnesium fluoride, silicon oxide, or silicon nitride. The protective layer 14 may be formed to a thickness of about 20 μm.

FIGS. 2A through 7 are cross-sectional views of a semiconductor device according to an exemplary embodiment of the present invention. A p-type oxide layer according to the present invention may be applied to an active-matrix driving device, a CMOS device, or various logic devices driven at high and low voltages, and the present embodiment describes a case where a p-type oxide layer is applied to a transistor or a diode.

Figure 2A:
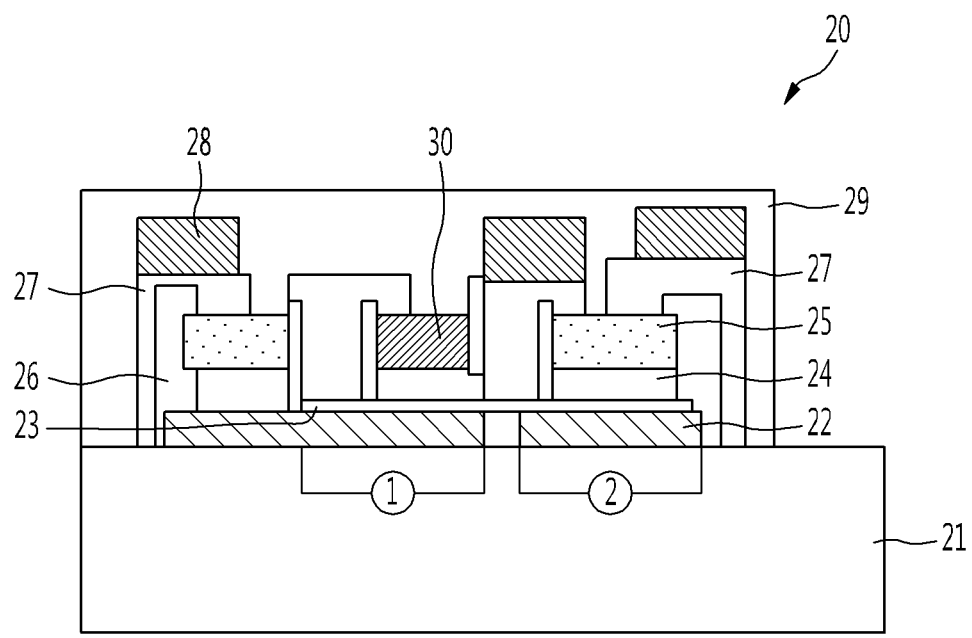
FIGS. 2A through 2C are construction diagrams of an asymmetric complementary-metal-oxide-semiconductor (CMOS) device according to an exemplary embodiment of the present invention.
Figure 2B:
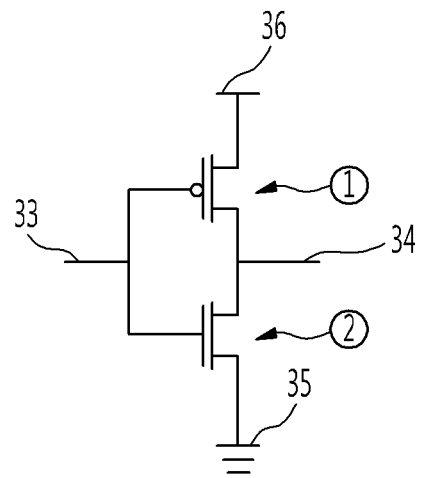
Figure 2C:
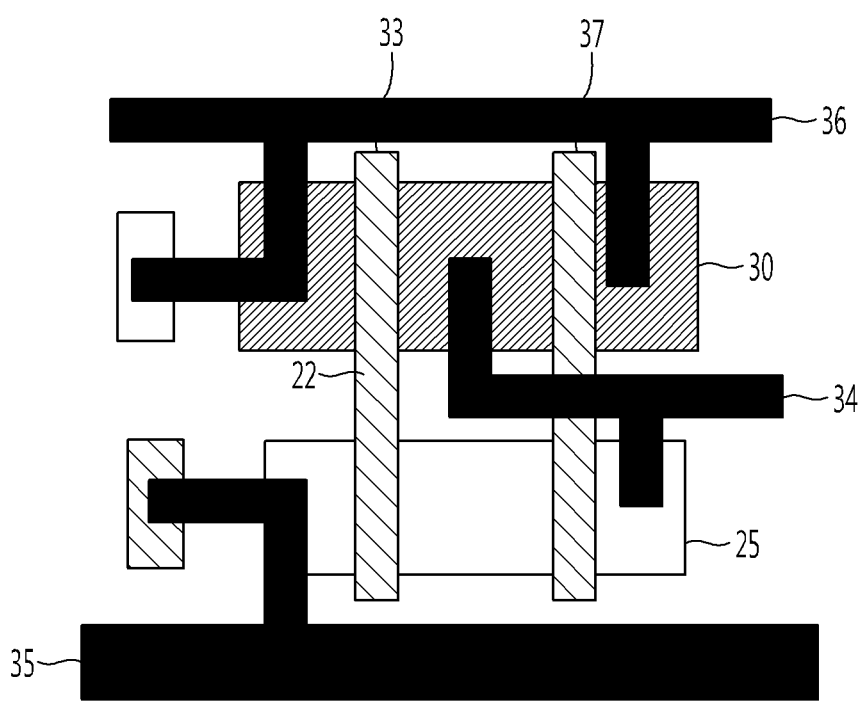

FIGS. 2A through 2C are construction diagrams of an asymmetric CMOS device according to an exemplary embodiment of the present invention. FIG. 2A is a cross-sectional view of the asymmetric CMOS device, FIG. 2B is a circuit diagram of the asymmetric CMOS device, and FIG. 2C is a diagram of a NAND logic gate using the asymmetric CMOS device.

As shown in FIG. 2A, an asymmetric CMOS device 20 according to an embodiment of the present invention may include a p-type transistor ① and an n-type transistor ②. In this case, the n-type transistor ② may operate in an enhancement mode, while the p-type transistor ① may operate in the enhancement mode when applied to a CMOS device, and operate in a depletion mode when applied to an inverter device. When operating in the depletion mode, the p-type transistor ① may operate using dynamic electric charges.

The above-described circuit structure may be applied to a digital circuit or logic gate because the p-type transistor ① and the n-type transistor ② are not turned on at the same time. That is, even if an electric field or voltage signal is applied to both the p-type transistor ① and the n-type transistor ②, the p-type transistor ① and the n-type transistor ② may not be turned on at the same time. Accordingly, the p-type transistor ① and the n-type transistor ② according to an embodiment of the present invention may be utilized in a switching key mode or an amplification mode of the CMOS device 20.

The p-type transistor ① and the n-type transistor ② may include a gate electrode 22, a gate insulating layer 23, a matching layer 24, and channel layers 25 and 30, and an insulating layer 26 may be disposed on sidewalls of the gate electrode 22, the gate insulating layer 23, the matching layer 24, and the channel layers 25 and 30. Source and drain electrodes 27 which is in contact with both edges of the channel layers 25 and 30 are included. The insulating layer 26 may be interposed between the source and drain electrodes 27 and the gate electrode 22, the gate insulating layer 23, and the channel layers 25 and 30. In addition, contact plugs 28 for external metal contacts may be disposed on the source and drain electrodes 27, and a protective layer 29 may be disposed on the entire resultant structure.

The gate electrode 22 may be formed of a metal layer or a highly conductive oxide, such as indium zinc oxide (IZO), gallium zinc oxide (GZO), or aluminum zinc oxide (AZO).

The gate insulating layer 23 may include silicon dioxide, alumina, hafnia, or silicon nitride. Also, the gate insulating layer 23 may be a cellulose thin layer or a bio-organic paper formed of natural cellulose or a natural or mixed material.

The matching layer 24 may be formed of $Ta_xO_y$. The matching layer 24 may have a thickness of 200000 nm or less. The matching layer 24 may be an insulating layer having a dense structure with a high electric resistance.

The source and drain electrodes 27 may be formed of a metal having very high electric conductivity. That is, the source and drain electrodes 27 may be formed of a material having about at least 1000 times the electric conductivity of channel layers 25 and 30. For example, the source and drain electrodes 27 may be formed of IZO, GZO, or AZO. A channel region may be provided between the source and drain electrodes 27. The distance between the source and drain electrodes may range between 1 and 100000 μm. Also, the source and drain electrodes 27 may be formed to a thickness between 2 nm and 200 μm.

The protective layer 29 may be formed of a polymer such as Su-8, $MgF_x$, or silicon nitride. The protective layer 29 may be formed to a thickness of about 200000 nm or less. The protective layer 29 may be an insulating layer having a dense structure with a high electric resistance.

Here, the p-type transistor ① may include a p-type oxide layer as the channel layer 30 according to an exemplary embodiment of the present invention. Also, the n-type transistor ② may include an n-type organic or inorganic layer formed of GSZO or AZTO as the channel layer 25. For example, the channel layer 25 of the n-type transistor ② may be an n-type semiconductor oxide layer or an n-type semiconductor layer such as a phosphorous (P)-doped silicon layer or a P-doped gallium arsenic (GaAs) layer.

The transistors ① and ② including the channel layers 25 and 30 may operate in an enhancement mode or depletion mode. That is, when a drain-source voltage is not applied, no current may flow through the CMOS device 20 irrespective of a gate voltage, or when a gate voltage is applied to the CMOS device 20, current may flow between a drain and a source even if a drain-source bias voltage is not applied.

In this case, the channel layer 30 of the p-type transistor ① may be spaced apart from the channel layer 25 of the n-type transistor ② at an interval between 2 nm an 1000000 μm, particularly, at an interval between 10 nm and 900 μm.

As shown in FIGS. 2B and 2C, an input signal terminal 33 and an output signal terminal 34 may be connected to the p-type transistor ① and the n-type transistor ②, respectively. Also, a bias voltage terminal 36 is connected to the source electrode 27 of the p-type transistor ①, and a reference voltage or ground voltage 35 is connected to the source electrode 27 of the n-type transistor ②. In FIGS. 2B and 2C, reference numeral 37 denotes an input terminal 2 of a logic gate.

Figure 3:
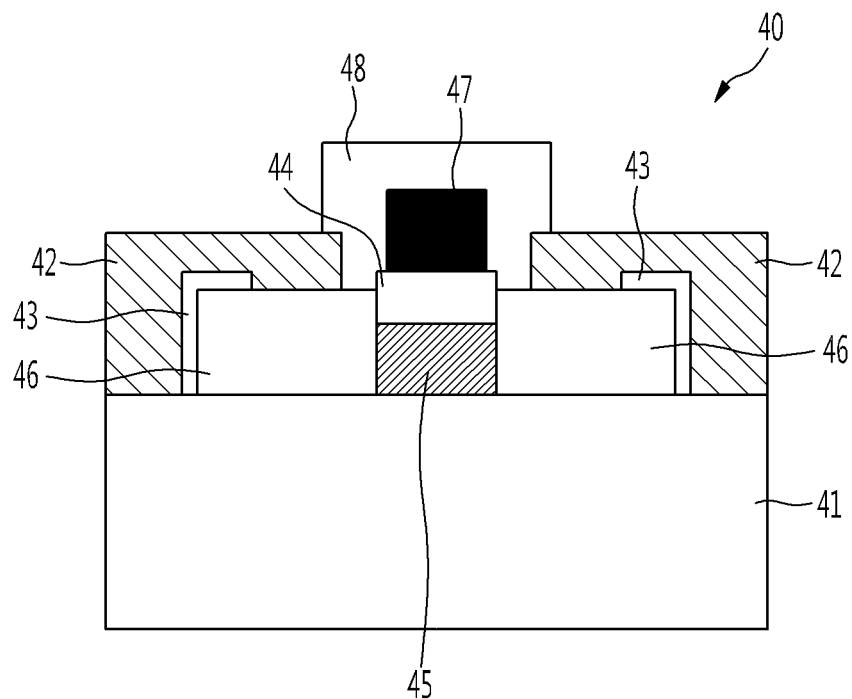
FIG. 3 is a cross-sectional view of a staggered thin-film transistor (TFT) according to an exemplary embodiment of the present invention.
Figure 4:
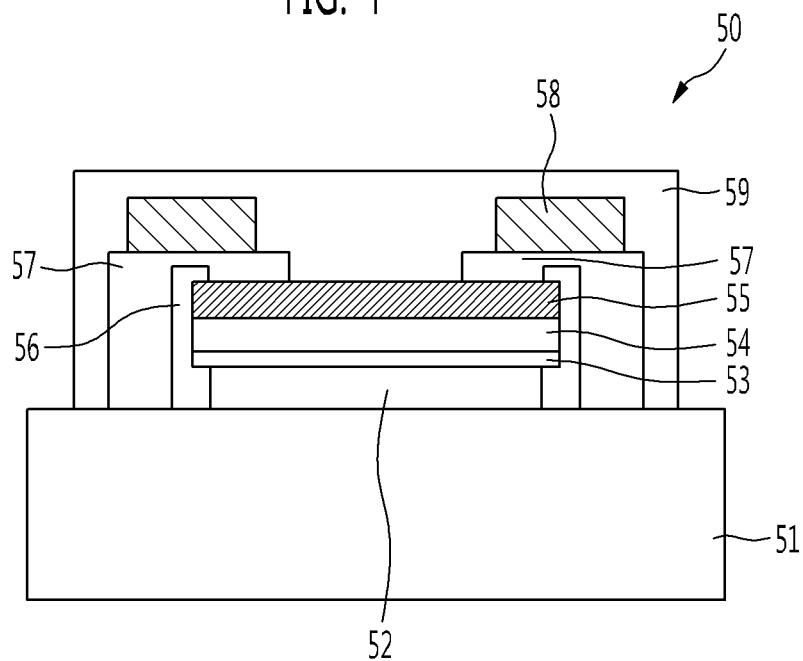
FIG. 4 is a cross-sectional view of a non-staggered asymmetric TFT according to an exemplary embodiment of the present invention.
Figure 5:
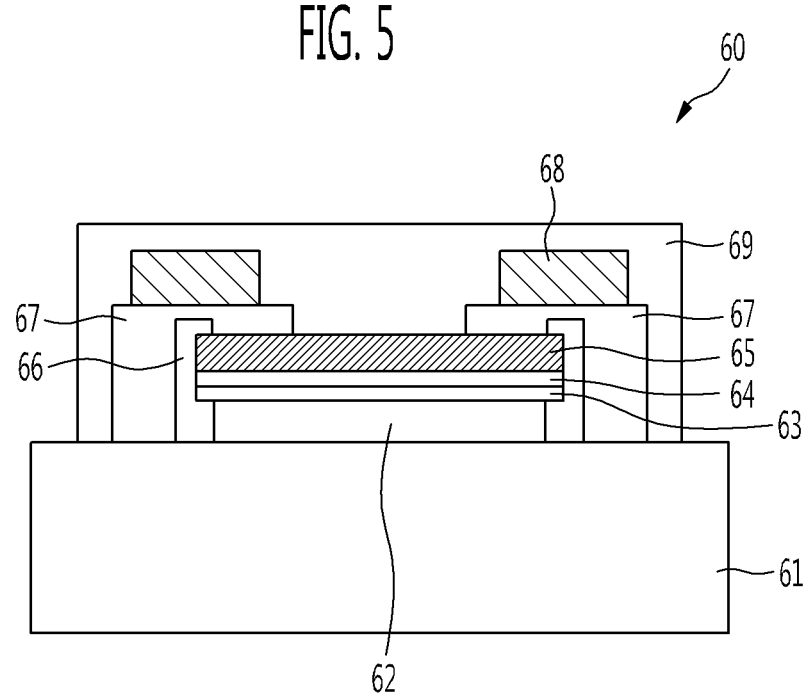
FIG. 5 is a cross-sectional view of a staggered asymmetric TFT according to an exemplary embodiment of the present invention.

FIGS. 3 through 5 are cross-sectional views of p-type field-effect transistors (FETs) according to an exemplary embodiment of the present invention. In particular, FIGS. 3 through 5 illustrate FETs including a p-type oxide layer according to an exemplary embodiment of the present invention.

The p-type FET may be used to switch from an on state to an off state or to amplify electrical and electronic signals.

Switching and amplification functions of the p-type FET may depend on a capacitance per unit area of a gate insulating layer, and an operating voltage of the p-type FET may range between 0 and −25V.

Hereinafter, the structure of a p-type FET and a method of manufacturing the same according to an exemplary embodiment of the present invention will be described.

FIG. 3 is a cross-sectional view of a staggered TFT according to an exemplary embodiment of the present invention.

Referring to FIG. 3, a staggered TFT 40 according to the embodiment of the present invention may include a channel layer 45, a matching layer 44, and a contact plug 47 that may be sequentially formed on a substrate 41. Source and drain electrodes 46 may contact sidewalls of the channel layer 45 and the matching layer 44. In addition, an insulating layer 43 may cover sidewalls and partial top surfaces of the source and drain electrodes 46, and gate electrodes 42 may contact the source and drain electrodes 46. Furthermore, a protective layer 48 may cover the contact plug 47 and the matching layer 44, which may be exposed between the gate electrodes 42.

A method of manufacturing the staggered TFT 40 will now be briefly described. To begin with, source and drain electrodes 46 may be formed on a substrate 41. Here, the source and drain electrodes 46 may be formed using a lithography process or a lift-off process. Thereafter, a channel layer 45 may be formed on a channel region between the source and drain electrodes 46 and contact the source and drain electrodes 46, and a matching layer 44 may be formed on the channel layer 45. An insulating layer 43 may be formed on sidewalls and partial top surface of the source and drain electrodes 46, and gate electrodes 42 may be formed to cover the gate insulating layer 43 and the source and drain electrodes 46. Afterwards, a contact plug 47 may be formed on the matching layer 44, and a protective layer 48 may be formed to cover the contact plug 47 and the matching layer 44, which may be exposed between the gate electrodes 42. Thereafter, although not shown in FIG. 3, the protective layer 48 may be etched to expose the surface of the contact plug 47. Also, an annealing process may be performed if required.

FIG. 4 is a cross-sectional view of a non-staggered asymmetric TFT according to an exemplary embodiment of the present invention.

Referring to FIG. 4, a non-staggered asymmetric TFT 50 according to the embodiment of the present invention may include a gate electrode 52, a gate insulating layer 53, a matching layer 54, and a channel layer 55, which may be sequentially formed on a substrate 51. An insulating layer 56 may be disposed on sidewalls of the gate electrode 52, the gate insulating layer 53, the matching layer 54, and the channel layer 55. Also, source and drain electrodes 57 may contact both ends of the channel layer 55. Furthermore, a contact plug 58 for external metal contact may be disposed on the source and drain electrodes 57, and a protective layer 59 may be disposed on the entire resultant structure.

A method of manufacturing the non-staggered asymmetric TFT 50 will now be briefly described.

To begin with, a substrate 51 may be prepared, and a conductive layer for a gate electrode may be formed on the substrate 51. For example, when a glass substrate is used as the substrate 51, the conductive layer for the gate electrode may be formed using a conductive oxide, such as ITO or IZO, or a metal, such as gold (Au). Thereafter, the conductive layer for the gate electrode may be etched using a lift-off technique, thereby forming a gate electrode 52. In this case, in consideration of required dimension and shape of the gate electrode 52, the gate electrode 52 may be formed such that adjacent gate electrodes 52 are spaced a sufficient distance apart from one another and pad contacts are reliably provided. The formation of the gate electrode 52 may be performed at a temperature of about 100° C. or lower.

In this case, the gate electrode 52 may be formed using a p-type oxide layer according to an exemplary embodiment of the present invention, for example, a p-type oxide layer having a lower resistivity than the channel layer 55. For instance, process conditions may be controlled such that the p-type layer has a resistivity between $10^0$ and $10^{-6}$ Ωcm. In addition, the gate electrode 52 may be formed of gold (Au), titanium (Ti), aluminum (Al), chromium (Cr), Cu, Ni, silver (Ag), an alloy thereof, or a stack structure thereof. Furthermore, the gate electrode 52 may be formed of indium zinc oxide (IZO), aluminum zinc oxide (AZO), gallium zinc oxide (GZO), tin zinc oxide (TZO), indium tin zinc oxide (ITZO), or tin oxide, or doped with fluorine (F) or another additive. Also, the gate electrode 52 may be formed using a highly conductive polymer, such as poly(3,4-ethylenedioxythiophene) (PEDOT).

Thereafter, the gate insulating layer 53 may be formed on the gate electrode 52. For example, the gate insulating layer 53 may be formed of an inorganic material such as silicon oxide or silicon nitride, an organic material such as polymethyl methacrylate (PMMA), poly(ortho-methoxyaniline) (POMA), or mylar, a single layer or multiple layer of materials such as tantalum oxide, hafnia, zirconia, ittria, and alumina, or composite materials such as hafnia/tantalum oxide, alumina/tantalum oxide, hafnia/alumina, silicon dioxide/tantalum pentoxide, tantalum oxide/yttria, or alumia/titanium oxide.

In this case, the gate insulating layer 53 may be formed to a thickness between 10 and 2000 nm. The formation of the gate insulating layer 53 may be performed at a temperature of about 200° C. Also, the film quality of the gate insulating layer 53 may be densified as much as possible to minimize a leakage current, and the work function of the gate insulating layer 53 may be controlled to obtain a required band offset when a channel layer is directly deposited on the gate insulating layer 53. Furthermore, the gate insulating layer 53 may have an amorphous, nano-crystalline, or polycrystalline structure and a smoothest possible surface. Thereafter, the gate insulating layer 53 may be patterned using a typical lithography process, a lift-off process, a mask process, or a direct writing process to determine patterning shape. When the gate insulating layer 53 is patterned using a lithography process, positive photoresist may be coated on an insulating material, and only a required portion of the insulating material may remain by removing unnecessary portions using exposure, developing, etching and cleaning processes.

Thereafter, a matching layer 54 may be formed on the gate insulating layer 53. The matching layer 54 may be formed to a thickness between 0.5 and 1000 nm. A thickness tolerance may be 0.15% or less of the above-described thickness of the matching layer 54.

Thereafter, a channel layer 55 may be formed on the matching layer 54 using a p-type oxide layer according to an exemplary embodiment of the present invention. A mask for the channel layer 55 may be slightly smaller than a mask for the insulating layer 56 and the dimension of the channel layer 55 is determined according to the purpose of a device. For example, the channel layer 55 may be formed to a length between 5 and 6000 nm, a width between 5 and 60000 nm, and a thickness between 1 and 10000 nm.

The formation of the channel layer 55 may be performed at a temperature of about 200° C. or lower. The formation of the channel layer 55 may include forming the p-type oxide layer and etching the p-type oxide layer using a lift-off process, a shadow mask process, an e-beam direct writing process, or a lithography process. The etching of the p-type oxide layer may be performed under conditions of a high etch selectivity not to cause damage to the gate insulating layer 53 and the matching layer 54.

After forming the channel layer 55, an annealing process may be performed if required. The annealing process may be performed at a temperature between 50 and 250° C. in consideration of the purpose of a device and the material of the substrate 51.

Thereafter, an insulating layer 56 may be formed on sidewalls of the gate electrode 52, the gate insulating layer 53, the matching layer 54, and the channel layer 55.

Subsequently, source and drain electrodes 57 may be formed to contact both ends of the channel layer 55. Here, materials and formation methods of the source and drain electrodes 57 may be determined in consideration of compatibility with preceding and subsequent processes. The source and drain electrodes 57 may be formed of a transparent material or opaque material, such as degenerated oxide or a metal, or the same material as the above-described material forming the gate electrode 52. For example, the source and drain electrodes 57 may be formed using a highly conductive organic, inorganic, or hybrid material, such as a p-type or n-type passive semiconductor material or a metal having high conductivity of at least $10^2$ S/cm.

Thereafter, a contact plug 58 may be formed on the source and drain electrodes 57, and a protective layer 59 may be formed on the resultant structure on which the contact plug 58 is formed. Naturally, before forming the protective layer 59, a matching layer may be further formed if required.

The protective layer 59 may be formed of MgF or silicon nitride ($Si_3N_4$). Also, the protective layer 59 may be formed to a thickness between 1 and 1000 nm, more preferably, between 100 and 300 nm.

Thereafter, although not shown, the protective layer 59 may be etched, thereby forming a window exposing the surface of the contact plug 58. The etching of the protective layer 59 may be performed using a lift-off process, a shadow mask process, an electronic beam (e-beam) direct writing process, or a lithography process.

Subsequently, an annealing process may be performed if required. For example, an annealing process may be performed for 20 minutes to 6 hours at a temperature of about 250° C. or lower. The annealing process may be performed in an atmosphere containing a gas mixture formed of nitrogen (N) and hydrogen (H) in a mixture ratio of 95 to 5, an inert gas containing Ar gas, or a reactive gas, such as oxygen ($O_2$) gas, hydrogen ($H_2$) gas, or fluorine ($F_2$) gas.

FIG. 5 is a cross-sectional view of a staggered asymmetric TFT according to an exemplary embodiment of the present invention.

Referring to FIG. 5, a staggered asymmetric TFT 60 according to the embodiment of the present invention may include a gate electrode 62, a gate insulating layer 63, a matching layer 64, and a channel layer 65 sequentially disposed on a substrate 61. An insulating layer 66 may be disposed on sidewalls of the gate electrode 62, the gate insulating layer 63, the matching layer 64, the gate insulating layer 63 and the channel layer 65. Asymmetric source and drain electrodes 67 may be disposed to contact both ends of the channel layer 65. Also, contact plugs 68 for external metal contacts may be disposed on the source and drain electrodes 67, respectively. A protective layer 69 may be disposed on the entire resultant structure.

Figure 6:
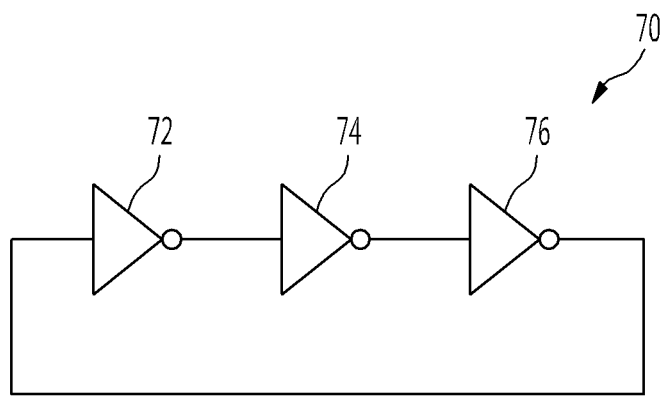
FIG. 6 is a circuit diagram of a ring oscillator according to an exemplary embodiment of the present invention.

Since the staggered asymmetric TFT 60 may be manufactured using the method described above with reference to FIG. 4, a detailed description of a method of manufacturing the staggered asymmetric TFT 60 will be omitted FIG. 6 is a circuit diagram of a ring oscillator according to an exemplary embodiment of the present invention.

Referring to FIG. 6, a ring oscillator 70 according to the embodiment of the present invention may have a ring structure in which three inverters 72, 74, and 76 are connected in series, and each of the inverters 72, 74, and 76 may have the same structure as the CMOS device described above with reference to FIGS. 2A through 2C.

Figure 7:
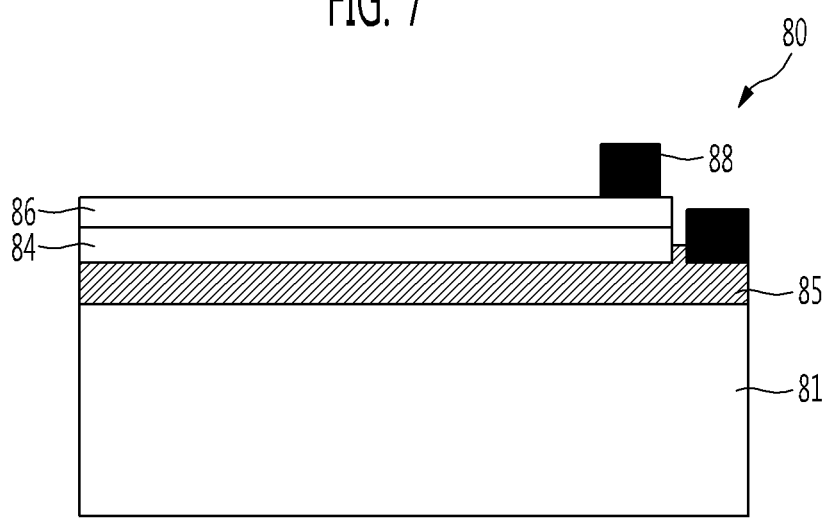
FIG. 7 is a cross-sectional view of a PN junction device according to an exemplary embodiment of the present invention.

FIG. 7 is a cross-sectional view of a PN junction device according to an exemplary embodiment of the present invention.

Referring to FIG. 7, a PN junction device 80 according to the embodiment of the present invention may include an n-type semiconductor layer 85, a matching layer 84, and a p-type semiconductor layer 86, which may be sequentially formed on a substrate 81, and contact plugs 88 may contact the n-type semiconductor layer 85 and the p-type semiconductor layer 86, respectively.

The n-type semiconductor layer 85 may be an n-type oxide layer formed of an inorganic material, such as GSTZO or AZTO, a covalent n-type semiconductor layer formed of silicon, a single or composite ionic material layer, or a low-resistive organic semiconductor layer. The n-type channel layer 85 may be formed to a thickness between 30 and 500000 nm.

The matching layer 84 may have a single layer structure of a tantalum oxide layer or a multiple structure obtained by stacking a silicon dioxide layer or silicon nitride layer having a thickness of about 1 nm or less.

The p-type semiconductor layer 86 may be a metal-containing p-type monoxide-based active semiconductor layer. The p-type semiconductor layer 86 may have a thickness between 5 and 20000 nm so as to ensure rectifying characteristics.

Figure 8:
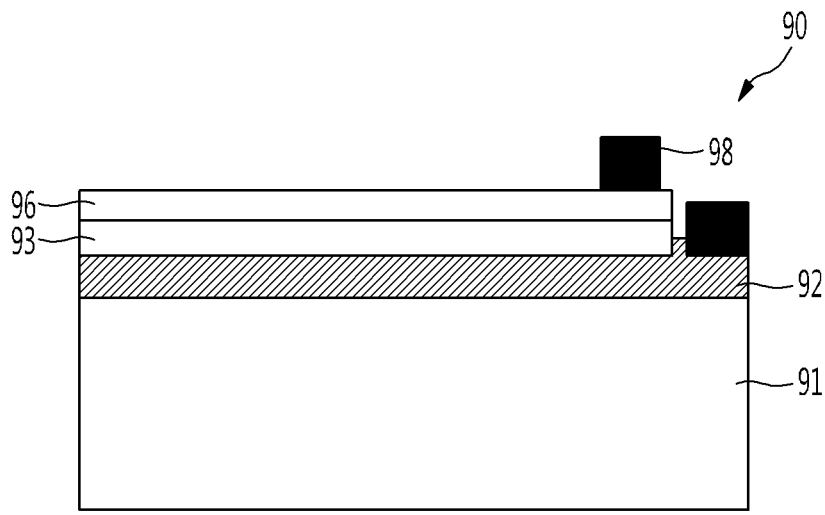
FIG. 8 is a cross-sectional view of a metal-insulator-semiconductor (MIS) diode device.

FIG. 8 is a cross-sectional view of a metal-insulator-semiconductor (MIS) diode device according to an exemplary embodiment of the present invention.

The MIS device may operate based on a field-effect principle. Charges collected in a semiconductor material may be a function of a voltage applied to a gate electrode, and current flowing through the semiconductor material may be a function of a capacitance per unit area of an insulating material.

As shown in FIG. 8, an MIS diode device 90 according to an exemplary embodiment of the present invention may include an n-type metal layer 92, an insulating layer 93, and a p-type semiconductor layer 96 sequentially formed on a substrate 91, and contact plugs 98 may contact the n-type metal layer 92 and the p-type semiconductor layer 96, respectively.

Here, the n-type metal layer 92 may be formed of a highly conductive oxide or a metal alloy. Also, the insulating layer 93 may have a thickness between 5 and 2000 nm.

FIGS. 9A through 9D are diagrams illustrating a method of manufacturing a p-type oxide layer according to an exemplary embodiment of the present invention.

The properties of the p-type oxide layer according to the embodiment of the present invention, for example, electrical, electronic, and optical properties, such as free hole concentration, inner and surface defects, electric conductivity, free carrier mobility, film density, dielectric constant, optical absorptivity, and reflectance, may depend on the composition of the p-type oxide layer, the method of forming the p-type oxide layer, and annealing conditions.

For example, when oxygen partial pressure varies during formation of the p-type oxide layer or an oxidizer or a reactive-gas atmosphere changes during an annealing process, the properties of the p-type oxide layer may also change. Accordingly, a method of forming a p-type oxide layer for embodying properties appropriate for the purpose of a device to which the p-type oxide layer is applied will be examined.

To form the p-type oxide layer according to the embodiment of the present invention, the composition of an oxide layer should be initially selected. That is, ratios of y to x and a to b of the above-described oxide composition and values $\alpha$ and $\beta$ ($0<\alpha<2$ and $0<\beta<2$) may be determined, and impurities to be added during the formation of the p-type oxide layer may be selected.

In addition, a method of depositing the p-type oxide layer may be selected. A physical technique, a physical chemical technique, or a chemical technique may be selected as the method of depositing the p-type oxide layer. A loadlock chamber may be employed according to the selected deposition method. For example, the p-type oxide layer may be formed using a vacuum resistive-thermal evaporation process, a vacuum thermal e-beam evaporation process, a direct-current (DC) or radio-frequency (RF) sputtering process, a magnetron-free sputtering process, an RF-CVD process, an RF-free CVD process, an inkjet process, a sol-gel process, or a deep coating process.

Furthermore, a deposition gas may be selected. For example, the kind of deposition gas, such as a single source or a multiple source, should be determined. Also, deposition atmosphere may be determined. For example, an atmosphere of an inert gas or a reactive gas in which a vacuum system will be used may be selected. Alternatively, a neutral solution, an acidic solution, or a basic solution may be selected as a solution used for a wet process, and UV light or ozone may be selected as a subsidiary energy source during the formation of the p-type oxide layer.

In addition, deposition conditions may be selected. The distance between a source and a substrate may be determined according to the size of the substrate. For example, when a p-type oxide layer is deposited on a substrate of 10 cm×10 cm using a sputtering process or a vapor evaporation process, the distance between the source and the substrate may range between 2 and 50 cm. When the substrate is about 1 m×1 m, the distance between the source and the substrate may increase to 150 cm.

Figure 9A:
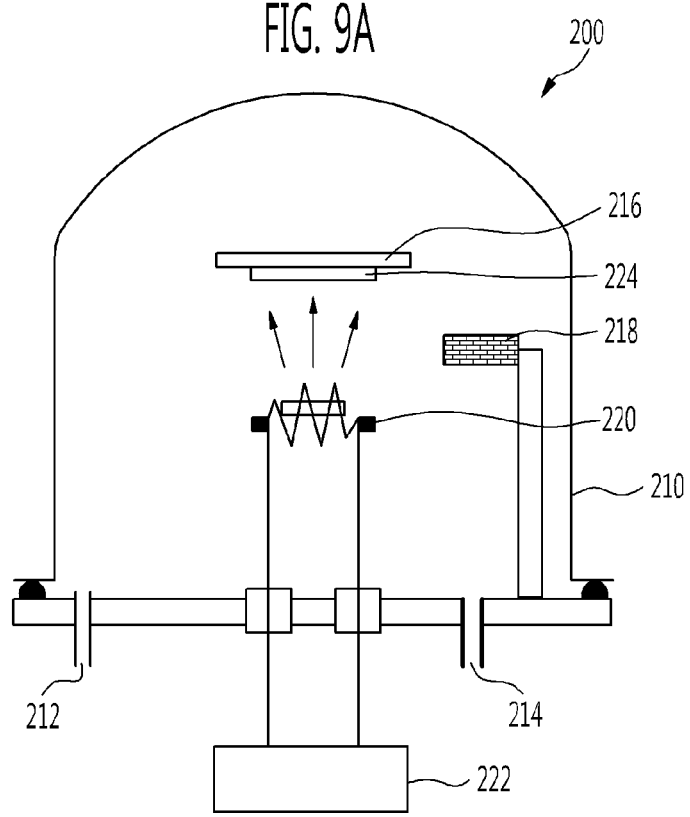
FIG. 9A is a diagram illustrating operations of a resistive thermal evaporator.
Figure 9B:
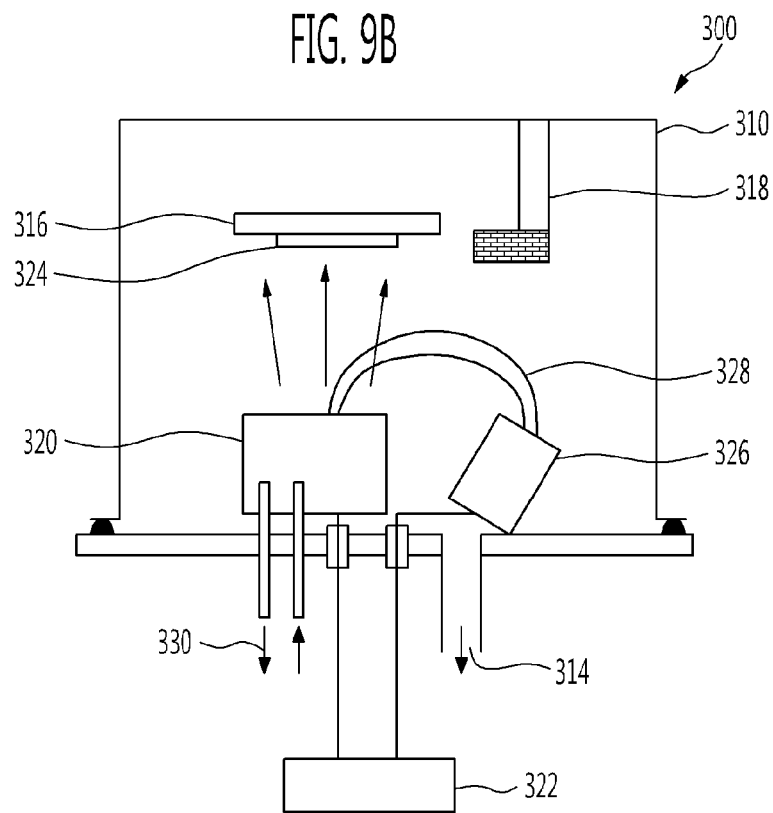
FIG. 9B is a diagram illustrating operations of an electronic-beam (e-beam) thermal evaporator.

FIGS. 9A and 9B are diagrams illustrating a method of manufacturing a p-type oxide layer using a thermal evaporation process according to an exemplary embodiment of the present invention. FIG. 9A illustrates operations of a resistive thermal evaporator, while FIG. 9B illustrates operations of an e-beam evaporator.

As shown in FIG. 9A, a resistive thermal evaporator 200 may include a process chamber 210, a gas injection port 212 configured to inject gases into the process chamber 210, and a gas discharge port 214 configured to discharge gases. Also, the resistive thermal evaporator 200 may further include a support 216 configured to fix a substrate 224 to the inside of the process chamber 210, a UV source 218, a heating resistor/boat 220, and a boat power source 222 connected to the heating resistor/boat 220.

By use of the resistive thermal evaporator 200 having the above-described structure, a voltage may be applied by the boat power source 222 to the heating resistor/boat 220 so that a p-type oxide layer can be deposited on the substrate 224.

As shown in FIG. 9B, an e-beam evaporator 300 may include a process chamber 310, a cooling system 330, and a discharge port 314. The e-beam evaporator 300 may include a support 316 configured to fix a substrate 324 to the inside of the process chamber 310, a UV source 318, an electronic gun 326, a boat 320, and a boat power source 322 connected to the boat 320. In FIG. 9B, reference numeral '328' denotes an e-beam focus.

By use of the e-beam evaporator 300 having the above-described structure, e-beams of the electronic gun 326 may be focused on and irradiated to the boat 320 so that a p-type oxide layer can be deposited on the substrate 324.

As described above, when a p-type oxide layer is deposited using a thermal evaporation process, the deposition of the p-type oxide layer may be performed under a reference pressure of about $10^{-7}$ Pa or lower, and a multiple deposition gas may be used to increase deposition speed. Also, the deposition of the p-type oxide layer may be performed as a fixing type (refer to the process chamber 210 in FIG. 9A) or a roll-to-roll type.

A deposition source may be metallic and may be formed of a single metal or a metal alloy according to the above-described composition. Also, the p-type oxide layer may be formed in an atmosphere of an oxidative gas, an inert gas, or a reactive gas while irradiating UV light if required. The oxidative gas may be $O_2$ gas, the inert gas may be Ar gas, He gas, or Xe gas, and the reactive gas may be $H_2$ gas, $F_2$ gas, or $N_2$ gas. When impurities are added, a first source serving as a metal source and a second source serving as an impurity source may be alternately supplied.

During the deposition process, $O_2$ gas may be supplied to maintain an oxidative process atmosphere (refer to the gas injection port 212 in FIG. 9A). An $O_2$ partial pressure may range between $10^{-2}$ and $10^{-5}$ Pa.

During the deposition process, the deposition pressure may be controlled by adjusting a filament current (refer to the boat power sources 222 and 322). In this case, deposition conditions may be determined in consideration of the size of the substrate 224 and 324, the distance between the substrate 224 and 324 and the source, and the number of deposition sources. In this case, a low voltage of about 50V or lower and a high current of about 500 A or less may be applied, and the deposition rate may range between 0.01 and 20 nm/s. For example, the deposition rate may be controlled to be between 0.01 and 20 nm/s by adjusting a filament current to 7 A or less.

In this case, when the p-type oxide layer contains a single metal, the p-type oxide layer may be formed using a single ceramic compound, and when the p-type oxide layer contains at least two metals, the p-type oxide layer may be formed using a compound of a plurality of ceramic materials. In this case, a metal deposition source and an impurity-containing ceramic composite source may be alternately disposed. Also, the oxidative process atmosphere may be maintained under an $O_2$ partial pressure between $10^{-2}$ and $10^{-7}$ Pa, and the deposition pressure may be controlled by adjusting a filament current. In this case, the deposition pressure may range between $10^{-1}$ and $10^{-4}$ Pa.

During the formation of the p-type oxide layer, metal- or ceramic-type composite zirconium (Zr) impurities may be added if required. For example, impurities may be added to an alloy material containing a main composition of the p-type oxide layer. Alternatively, the p-type oxide layer may be formed using a co-deposition process, which may include preparing a first source containing a main composition and a second source containing impurities, and simultaneously depositing the first and second sources. In this case, impurities of 0.2% or less, based on the weight of the total composition, may be added.

Figure 9C:
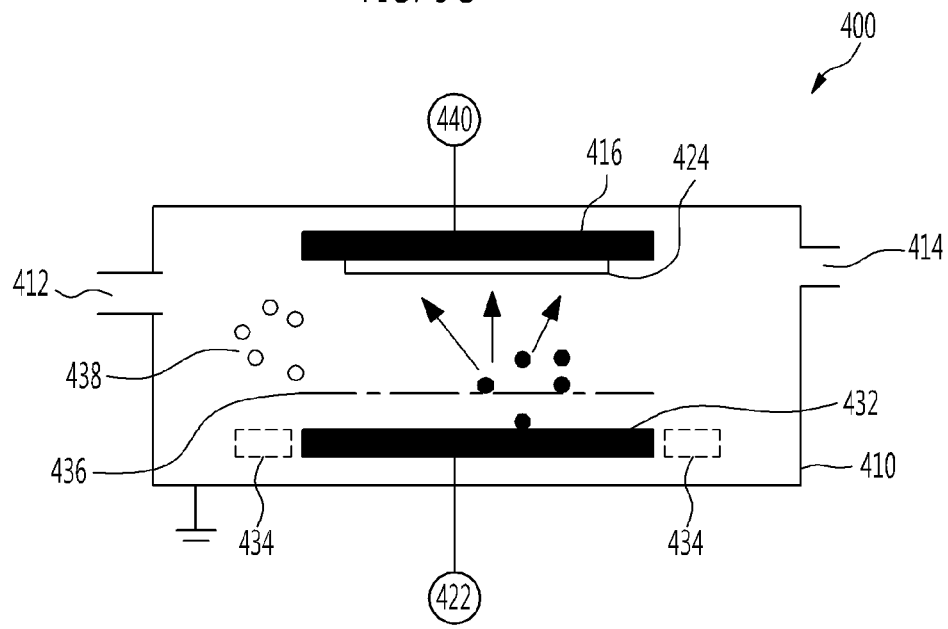
FIG. 9C is a diagram illustrating operations of a sputter apparatus.

FIG. 9C is a diagram illustrating a method of manufacturing a p-type oxide layer using a sputtering process, that is, the operations of a sputtering apparatus, according to an exemplary embodiment of the present invention.

A sputtering apparatus 400 may accelerate an ionized gas 438, for example, Ar gas, due to an electric field to allow collision of the Ar gas with a source material. Thus, atoms may spring out of a thin layer material due to the collision and be deposited on a substrate 424, thereby forming a p-type oxide layer.

As shown in FIG. 9C, the sputtering apparatus 400 may include a process chamber 410, a gas injection port 412, and a gas discharge port 414. Also, the sputtering apparatus 400 may further include a support 416 configured to fix a substrate 424 to the inside of the process chamber 410, an electrode 432, a bias net 436 interposed between the support 416 and the electrode 432, and a reactive gas spraying device 434.

Here, the electrode 432 may be a DC or RF power source input terminal, and the reactive gas spraying device 434 may be disposed near a target and formed of a nonconductive material. Also, a substrate bias voltage terminal 440 may be connected to the support 416, and a boat power source 422 may be connected to the electrode 432.

By use of the sputtering apparatus 400, a p-type oxide layer may be formed using a DC or RF sputtering process or a co-sputtering process. In the case of the co-sputtering process, a magnetron apparatus may be added if required. Also, the p-type oxide layer may be formed by depositing a metal target in an oxidative atmosphere or using a ceramic source having the corresponding composition.

Here, the deposition rate may be controlled to be in the range between 0.01 and 20 nm/s by adjusting the deposition energy (i.e., DC or RF power) between 0.01 and 20 W/cm$^2$. Also, the partial pressure of each of an inert gas and a reactive gas may range between $5\times10^{-2}$ and $10^{-5}$ Pa, and the deposition pressure may range between $5\times10$ and $10^{-4}$ Pa. Here, the inert gas may be argon (Ar) gas, helium (He) gas, or xenon (Xe) gas. The reactive gas may be oxygen (O), hydrogen (H), fluorine (F), or a combination thereof. Also, the metal target may be deposited at a temperature of about 200° C.

Furthermore, when the p-type oxide layer is formed on a substrate of 10 cm×10 cm, the distance between a source and the substrate may range between 2 and 50 cm. Also, when the substrate is about 1 m×1 m, the distance between the source and the substrate may be about 150 cm or less.

Figure 9D:
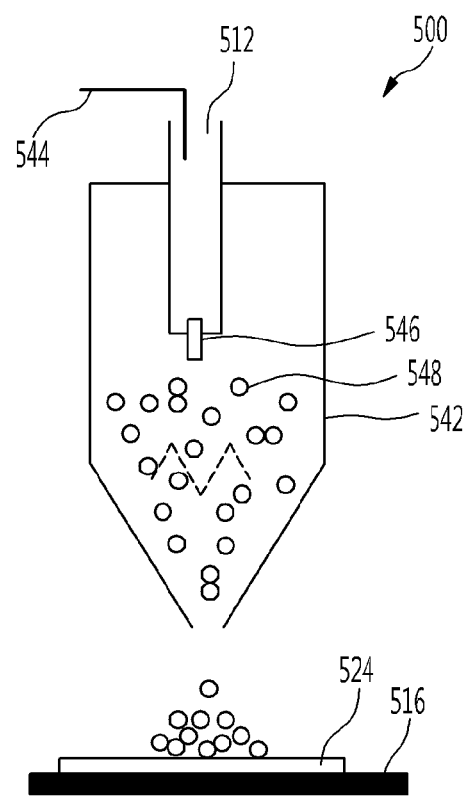
FIG. 9D is a diagram illustrating operations of an inkjet apparatus.

FIG. 9D is a diagram illustrating a method of manufacturing a p-type oxide layer using an inkjet process, that is, the operations of an inkjet apparatus.

As shown in FIG. 9D, an inkjet apparatus 500 may include an ink container 542, a gas injection port 512, and an inkjet gas injection port 544 configured to push a chemical solution from the gas injection port 512 toward a sprayer 546. The ink container 542 may include the sprayer 546 configured to spray an injected chemical solution. Also, a support 516 configured to support a substrate 524 may be installed below the ink container 542.

When a p-type oxide layer is formed using an inkjet process, copper (Cu), tin (Sn), nickel (Ni), or an alloy thereof may be diluted with a basic, neutral, or acidic chemical solution mixture or alcohol, thereby preparing a fine-grained solution containing suspended nanoparticles 548 with a size of about 50 nm or less. Here, alcohol may be ethyl alcohol, methyl alcohol, or propanol. Thereafter, the fine-grained solution heated to a temperature of about 400° C. or lower or an unheated fine-grained solution may be sprayed. The sprayed suspended nanoparticles 548 may be sprayed by a heating resistor or bias (refer to a dotted line in FIG. 9D), thereby forming the p-type oxide layer on the surface of the substrate 524. In this case, the substrate 524 may be heated up to a temperature of about 200° C. or less according to the kind of solvent and the substrate 524.

Although the present specification describes that a p-type oxide layer is formed using a thermal evaporation process, a sputtering process, or an inkjet process, the present invention is not limited thereto, but the p-type oxide layer may be formed using a physical process, a physical chemical process, or a chemical process, such as a pulse laser deposition (PLD) process, an atomic layer epitaxy (ALE) or molecular layer epitaxy (MLE) process, a sol-gel process, a plating process, a spray atomized pyrolysis process, and a spin coating process.

For example, when the p-type oxide layer is formed using the chemical process, a deposition process may be performed using a specific solution or suspension in which copper (Cu), tin (Sn), nickel (Ni), or an alloy thereof and impurities are dissolved. Here, the separation rate of the solution or suspension may be controlled according to the sizes of nano-drops, the jet device, and the sprayer. The p-type oxide layer may be formed at a rate between 0.01 and 10 nm/s.

Here, the p-type oxide layer may be formed to a thickness between 1 and 10000 nm according to the purpose of a device, for example, depending on whether the device is a passive device or an active device. Also, a substrate may be formed of an insulating material, a conductive material, or a semiconductor material according to the purpose of a device. An insulating substrate may be formed of glass, a polymer, or a cellulose paper, a conductive substrate may be formed of stainless steel or molybdenum, and a semiconductor substrate may be formed of single crystalline silicon, polycrystalline silicon, or oxide.

During the formation of the p-type oxide layer, the substrate may be fixed in one position or movable so that the p-type oxide layer can be formed on the entire surface of the substrate to a uniform thickness. The p-type oxide layer formed using the above-described process may have an amorphous structure, a nano-crystalline structure, or a polycrystalline structure.

After forming the p-type oxide layer, an annealing process may be performed at a temperature between 50 and 250° C. for 20 minutes to 6 hours if required. In this case, the p-type oxide layer may be annealed in an atmosphere of oxygen, nitrogen, a mixture of hydrogen and nitrogen, a mixture of nitrogen and fluorine, or a mixture of nitrogen and oxygen under an atmospheric pressure or in a vacuum, for example, under a pressure between $10^{-2}$ and 1000 Pa.

Figure 10A:
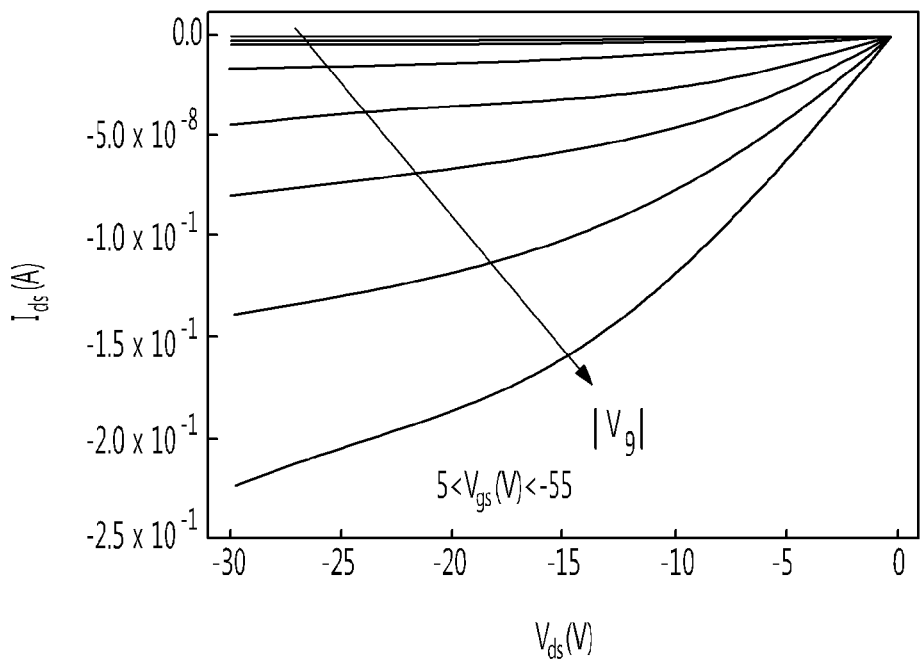
FIGS. 10A and 10B are graphs showing characteristics of a p-type oxide thin-film transistor (TFT) using a copper(Cu)-containing copper monoxide $[(OCu_2)_x+(Cu_{1-2})_y, 0.05 \leq x \leq 1$ and $0.01 \leq y \leq 0.9]$ according to an exemplary embodiment of the present invention.
Figure 10B:
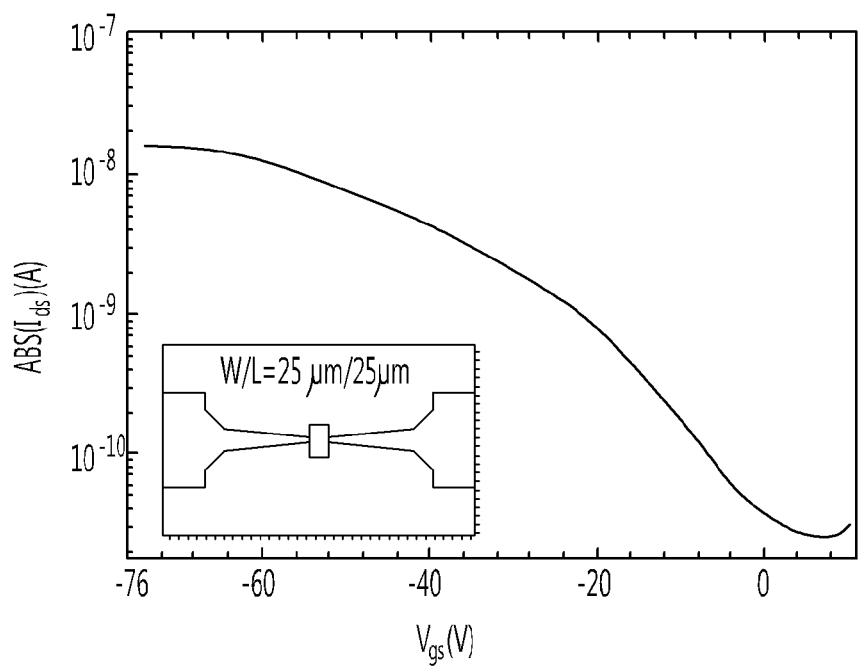

FIGS. 10A and 10B are graphs showing characteristics of a p-type oxide TFT to which a copper-containing copper monoxide layer $[(OCu_2)_x+(Cu_{1-2})_y, 0.05 \leq x < 1$ and $0.01 \leq y \leq 0.9]$ is applied, according to an exemplary embodiment of the present invention.

The p-type oxide TFT used for measurements was manufactured by coating an ATO insulating layer as a gate insulting layer on a glass substrate. A gate electrode was formed of an ITO layer, and source and drain electrodes were formed of gold (Au).

FIG. 10A is a graph showing output characteristics of a p-type oxide TFT according to an exemplary embodiment of the present invention. In FIG. 10A, an abscissa denotes a drain-source voltage Vds, and an ordinate denotes a drain-source voltage Ids.

The output characteristics of the p-type oxide TFT were measured by varying a gate-source voltage with a source electrode grounded. Each data line denotes a characteristic curve measured by varying a gate voltage VG at an interval of about 10V between −55V and +5V.

From FIG. 10A, it can be confirmed that current flows during application of a negative voltage. Thus, it can be seen that the transistor according to the present invention exhibits the characteristics of the p-type TFT.

FIG. 10B is a graph showing a transfer curve of a p-type oxide TFT according to an exemplary embodiment of the present invention. An abscissa denotes a gate-source voltage Vgs, and an ordinate denotes a drain-source current Ids.

Measurement results were obtained by fixing the drain-source voltage Vds at 2V. From FIG. 10B, it can be seen that an on/off ratio of the transistor was $10^{-3}$ or more which corresponds to a hole mobility of 0.05 $cm^2$/Vs or more. Accordingly, it can be seen that the transistor according to the present invention exhibits relatively good mobility characteristics among now known p-type oxide TFTs.

Figure 11A:
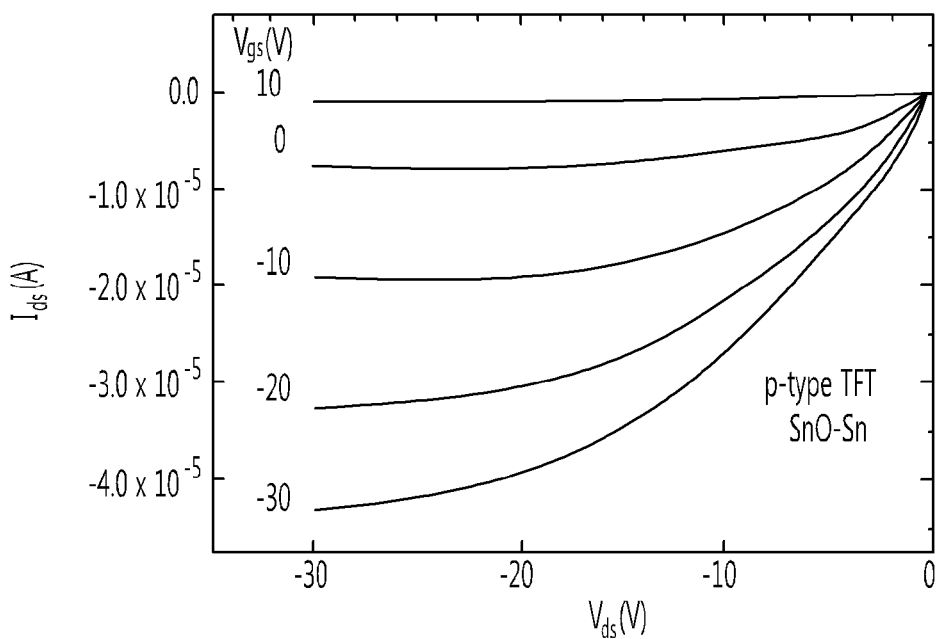
FIGS. 11A and 11B are graphs showing characteristics of a p-type oxide TFT using a tin (Sn)-containing tin monoxide $[(OSn)_z+(Sn_{1-2})_w, 0.05 \leq z < 1$ and $0.01 \leq w \leq 0.9]$ according to an exemplary embodiment of the present invention.
Figure 11B:
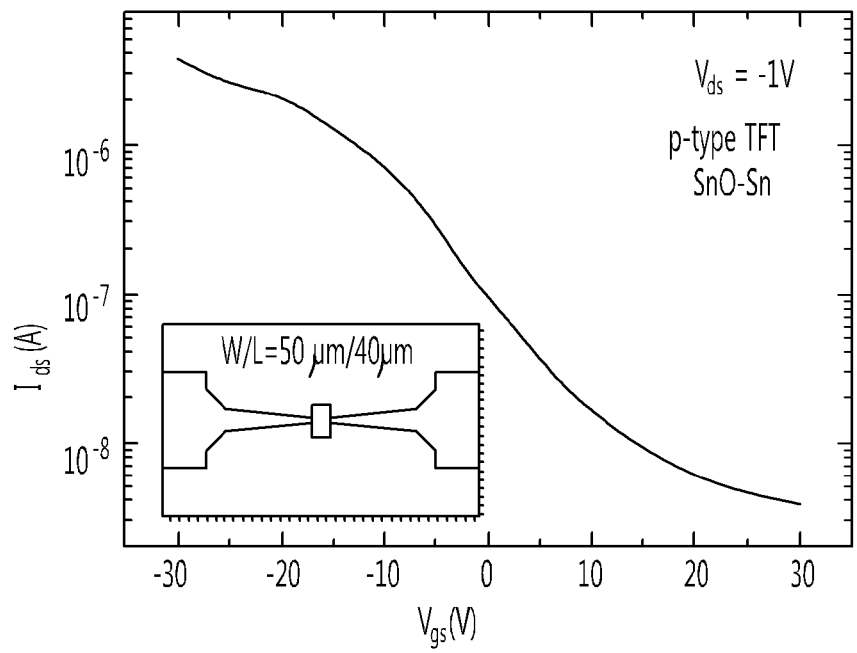

FIGS. 11A and 11B are graphs showing characteristics of a p-type oxide TFT to which a tin-containing tin monoxide layer $[(OSn)_z+(Sn_{1-2})_w, 0.05 \leq z < 1$ and $0.01 \leq w \leq 0.9]$ is applied, according to an exemplary embodiment of the present invention.

The p-type oxide TFT used for measurements was manufactured by coating an ATO insulating layer on a glass substrate. A gate electrode was formed of an ITO layer, and source and drain electrodes were formed of gold(Au).

FIG. 11A is a graph showing output characteristics of a p-type oxide TFT according to an exemplary embodiment of the present invention. In FIG. 11A, an abscissa denotes a drain-source voltage Vds, and an ordinate denotes a drain-source current Ids.

The output characteristics of the transistor were measured by varying a gate-source voltage with a source electrode grounded. Each data line denotes a characteristic curve measured by varying a gate voltage VG at an interval of about 10V.

From FIG. 11A, it can be confirmed that current flows during application of a negative voltage. Thus, it can be seen that the transistor according to the present invention exhibits the characteristics of the p-type TFT.

FIG. 11B is a graph showing a transfer curve of a p-type oxide TFT according to an exemplary embodiment of the present invention. In FIG. 11B, an abscissa denotes a gate-source voltage Vgs, and an ordinate denotes a drain-current source Ids.

Measurement results were obtained by fixing the drain-source voltage Vds at –1V. From FIG. 11B, it can be seen that an on/off ratio of the transistor was $10^4$ or more, which corresponds to a hole mobility of 1.4 $cm^2$/Vs or more. Accordingly, it can be seen that the transistor according to the present invention exhibits the characteristics of the p-type TFT.

Figure 12A:
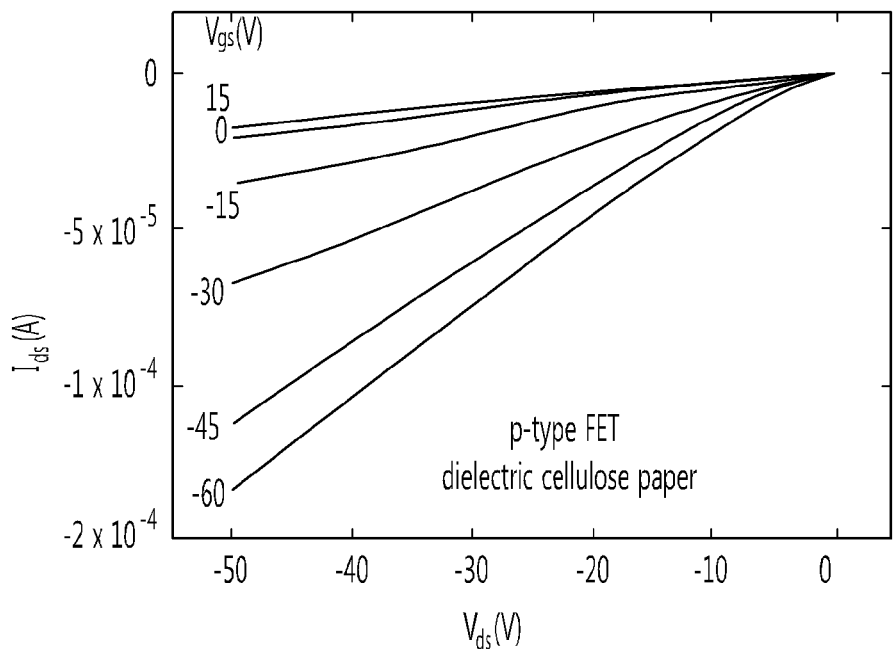
FIGS. 12A and 12B are graphs showing characteristics of a p-type oxide TFT using a tin (Sn)-containing tin monoxide $[(OSn)_z+(Sn_{1-2})_w, 0.05 \leq z \leq 1$ and $0.01 \leq w \leq 0.9]$ according to an exemplary embodiment of the present invention.
Figure 12B:
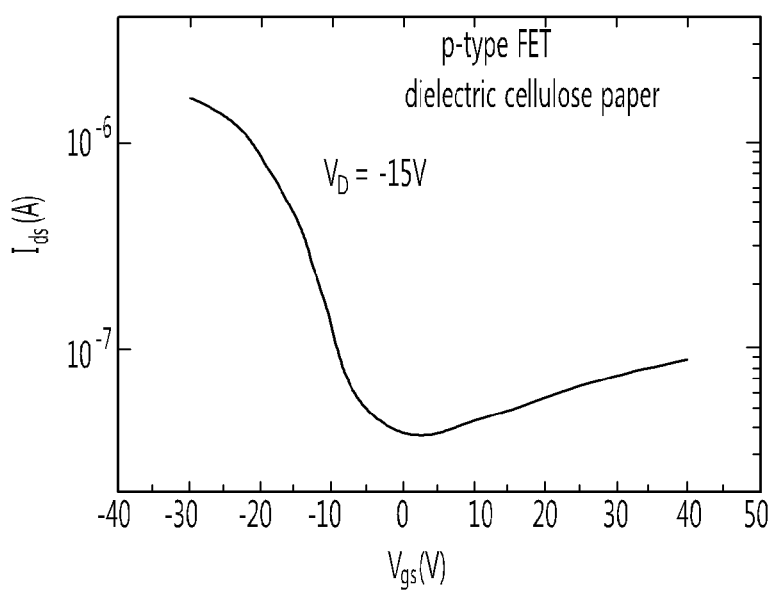

FIGS. 12A and 12B are graphs of a p-type oxide TFT to which a tin-containing tin monoxide layer $[(OSn)_z+(Sn_{1-2})_w, 0.05 \leq z < 1$ and $0.01 \leq w \leq 0.9]$ is applied, according to an exemplary embodiment of the present invention.

The p-type oxide TFT used for measurements was manufactured using paper serving as both a substrate and an insulating layer. A gate electrode was formed of an indium zinc oxide (IZO) layer, and source and drain electrodes were formed of gold (Au).

FIG. 12A is a graph showing output characteristics of a p-type oxide TFT according to an exemplary embodiment of the present invention. In FIG. 12A, an abscissa denotes a gate-source voltage Vgs, and an ordinate denotes a drain-source current Ids.

The output characteristics of the transistor were measured by varying a gate-source voltage with a source electrode grounded. Each data line denotes a characteristic curve measured by varying a gate voltage VG at an interval of about 15V between –60V and +15V.

FIG. 12B is a graph showing a transfer curve of a p-type oxide TFT according to an exemplary embodiment of the present invention. In FIG. 12B, an abscissa denotes a gate-source voltage Vgs, and an ordinate denotes a drain-source current Ids.

Measurement results were obtained by fixing the drain-source voltage Vds at 15V. From FIG. 12B, it can be seen that an on/off ratio of the transistor was about $5 \times 10^2$, which corresponds to a hole mobility of 1.8 $cm^2$/Vs or more.

According to the present invention, a semiconductor device using a metal-containing p-type oxide layer as a channel layer or an electrode, and a method of manufacturing the same may be provided. In particular, the present invention provides a semiconductor device using a p-type oxide layer based on at least one oxide selected from the group consisting of a Cu-containing copper monoxide, a Sn-containing tin monoxide, a copper-tin oxide containing a Cu—Sn alloy, and a nickel tin oxide containing a Ni—Sn alloy, and a method of manufacturing the same.

An OLED device using an inorganic material having p-type characteristics can be advantageous for active drive operations. Also, transparent or opaque devices may be easily developed using a p-type metal oxide layer. For example, a transparent CMOS device can be manufactured using a p-type oxide layer according to the present invention.

In addition, according to the present invention, since a semiconductor device is manufactured using a low-temperature process, the manufacturing process can be simplified, and manufacturing costs can be reduced. In particular, since the manufacture of the semiconductor device is enabled even at low temperatures, for example, room temperature, an inexpensive, flexible substrate, such as a polymer substrate or paper, may be employed. Accordingly, large-area products can be produced at low temperatures by means of simple manufacturing processes using low-priced process techniques, thus contributing toward developing various new devices that can be manufactured using only oxides and low-temperature processes.

Furthermore, a p-type oxide layer according to the present invention can be manufactured using conventional manufacturing techniques used for electronic, photoelectronic, and semiconductor industries, for example, RF and DC sputtering processes, a large-area cathode sputtering process, a resistive or e-beam thermal evaporation process, a plasma-enhanced CVD (PECVD) process, a sol-gel process, or an inkjet printing process. Thus, no additional investments are required for related research and development (R&D).

Devices and integrated circuits (ICs) manufactured using the resultant structures according to the present invention can be applied to electronic devices, semiconductor devices, flat panel displays (FPDs), logic circuit devices, apparatuses and sensors, medical and bio devices, photoelectronic devices, and micro/nano-electronic industries. Also, devices according to the present invention can be directly applied to general electronic industries using field-effect devices, such as switches or amplifiers. For example, the devices according to the present invention can be applied to data-oriented circuits (drivers), displays, logic circuits such as inverter logic gates, AND-OR logic gates, and NAND-NOR logic gates, ring oscillators, shift registers, radio-frequency identifications (RFIDs), smart labels, smart apparatuses including safety transparent electronic devices and sensors, heterojunction devices such as MIS diodes, CMOS devices, apparatus manufacturing industries, medical and/or food industries, such as medical components, control circuits, and signal switching circuits, national defense industries such as stealth techniques and transparent display devices, solar cells, biotechnology, and nano-electronic devices.

In the drawings and specification, there have been disclosed typical preferred embodiments of the invention and, although specific terms are employed, they are used in a generic and descriptive sense only and not for purposes of limitation. As for the scope of the invention, it is to be set forth in the following claims. Therefore, it will be understood by those of ordinary skill in the art that various changes in form and details may be made therein without departing from the spirit and scope of the present invention as defined by the following claims.

What is claimed is:

1. A method of manufacturing a semiconductor device, comprising forming a p-type oxide layer on a substrate with a partial pressure of a dioxygen ($O_2$) gas ranging between $10^{-5}$ and $10_{-2}$ Pa, the p-type oxide layer formed of at least one oxide selected from the group consisting of a copper(Cu)-containing copper monoxide, a tin(Sn)-containing tin monoxide, a copper tin oxide containing a Cu—Sn alloy, and a nickel tin oxide containing a Ni—Sn alloy.

2. The method according to claim 1, wherein the forming of the p-type oxide layer is performed using a resistive or electronic-beam (e-beam) thermal evaporation process, a direct-current (DC) sputtering process, a radio-frequency (RF) sputtering process, a co-sputtering process, a pulse laser deposition (PLD) process, an atomic layer epitaxy (ALE) process, a molecular layer epitaxy (MLE) process, a sol-gel process, a plating process, a spray atomized pyrolysis process, an ink-jet process, or a spin coating process.

3. The method according to claim 1, wherein the forming of the p-type oxide layer is performed at a room temperature or at a temperature of about 250° C. or lower.

4. The method according to claim 1, after the forming of the p-type oxide layer, further comprising annealing a resultant structure including the p-type oxide layer at a temperature between 50° C. and 250° C. for about 20 minutes to 6 hours.

5. The method according to claim 1, wherein the forming of the p-type oxide layer is performed at a pressure between $10^{-6}$ and $10^5$ Pa, further wherein the forming of the p-type oxide layer includes forming the p-type oxide layer in an atmosphere of argon (Ar) gas, serving as an atmospheric gas, and dioxygen ($O_2$) gas, nitrogen (N) gas, or fluorine (F) gas serving as an additive gas, with a partial pressure of the Ar gas ranging between $10^{-5}$ and 10 Pa, and content of the F gas ranging between 0.00 to 0.99% by weight, based on a total weight of the $O_2$ gas.

6. The method according to claim 1, wherein the forming of the p-type oxide layer is performed at a deposition rate between 0.01 and 20 nm/s.

7. The method according to claim 1, wherein the forming of the p-type oxide layer is performed at a process energy of a deposition apparatus that deposits the p-type oxide layer between 0.1 and 20 W/cm².

8. The method according to claim 1, wherein the forming of the p-type oxide layer includes forming the p-type oxide layer using argon (Ar) gas as an atmospheric gas, and a deposition gas, and a distance between a source of the deposition gas and the substrate ranges between 2 and 50 cm.

9. The method according to claim 1, wherein the forming of the p-type oxide layer is performed in an atmosphere of an oxidative gas, an inert gas, or a reactive gas.

10. The method according to claim 1, wherein the forming of the p-type oxide layer is performed using Ar gas, a mixture of oxygen (O) and Ar, nitrogen (N) gas, or a mixture of N and hydrogen (H).

11. The method according to claim 1, wherein the forming of the p-type oxide layer comprises sputtering to deposit the p-type oxide layer.

12. The method according to claim 11, wherein the sputtering includes depositing the p-type oxide layer at a temperature of about 200° C.

13. The method according to claim 1, wherein the forming the p-type oxide comprises maintaining a process temperature, the process temperature ranging from about room temperature to about 200° C., and the maintaining the process temperature is concurrent with a deposition of the p-type oxide layer on the substrate.

14. The method according to claim 1, wherein the substrate is a flexible substrate.

15. The method according to claim 1, wherein the substrate is a polymer substrate.

16. The method according to claim 1, wherein the substrate is a paper substrate.

17. The method according to claim 1, wherein the forming of the p-type oxide layer is performed at a pressure between $10^{-6}$ and $10^5$ Pa, further wherein the forming of the p-type oxide layer includes forming the p-type oxide layer in an atmosphere of argon (Ar) gas, serving as an atmospheric gas, and dioxygen ($O_2$) gas, serving as an additive gas, with a partial pressure of the Ar gas ranging between $10^{-5}$ and 10 Pa, a partial pressure of the $O_2$ gas ranging between $10^{-5}$ and $10^3$ Pa, and including another gas selected from the group consisting of hydrogen (H) gas, nitrogen (N) gas, and fluorine (F) gas.

* * * * *